(12) United States Patent
Kim et al.

(10) Patent No.: US 11,749,206 B2
(45) Date of Patent: Sep. 5, 2023

(54) DISPLAY APPARATUS

(71) Applicant: Samsung Display Co., Ltd., Yongin-si (KR)

(72) Inventors: Hyuk Kim, Yongin-si (KR); Yanghwa Choi, Yongin-si (KR); Junghwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/657,256

(22) Filed: Mar. 30, 2022

(65) Prior Publication Data

US 2023/0113452 A1 Apr. 13, 2023

(30) Foreign Application Priority Data

Oct. 8, 2021 (KR) .......................... 10-2021-0134439

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0819* (2013.01); *G09G 2300/0861* (2013.01); *G09G 2310/08* (2013.01); *G09G 2320/0233* (2013.01); *G09G 2360/16* (2013.01)

(58) Field of Classification Search
None
See application file for complete search history.

(56) References Cited

U.S. PATENT DOCUMENTS

| | | | |
|---|---|---|---|
| 9,320,967 B2 | 4/2016 | Knutsson | |
| 10,235,942 B2 | 3/2019 | Choi | |
| 11,127,339 B2 | 9/2021 | Kim et al. | |
| 2005/0253791 A1* | 11/2005 | Shin | G09G 3/3266 345/76 |
| 2006/0152459 A1* | 7/2006 | Shin | G09G 3/3266 345/94 |
| 2006/0156121 A1* | 7/2006 | Chung | G09G 3/3233 714/726 |
| 2016/0351124 A1* | 12/2016 | Kim | G09G 3/3241 |
| 2017/0032733 A1* | 2/2017 | Jang | G09G 3/20 |
| 2018/0138256 A1* | 5/2018 | Han | G09G 3/3275 |

(Continued)

FOREIGN PATENT DOCUMENTS

| | | |
|---|---|---|
| KR | 10-2017-0076886 A | 7/2017 |
| KR | 10-2018-0079087 A | 7/2018 |

(Continued)

*Primary Examiner* — Dorothy Harris
(74) *Attorney, Agent, or Firm* — Lewis Roca Rothgerber Christie LLP

(57) ABSTRACT

A display apparatus includes: a pixel part including a plurality of pixels, each of the plurality of pixels to receive a first scan signal and an emission signal; and a scan driver to output the first scan signal and the emission signal to each of the plurality of pixels. In a second driving mode in which the display apparatus is driven with a first driving frequency lower than a maximum driving frequency, the scan driver is to supply the first scan signal to the plurality of pixels according to the first driving frequency, and supply the emission signal to the plurality of pixels according to the maximum driving frequency.

20 Claims, 14 Drawing Sheets

(56) References Cited

U.S. PATENT DOCUMENTS

| | | | |
|---|---|---|---|
| 2018/0293939 A1* | 10/2018 | Kim | H01L 51/5203 |
| 2019/0066604 A1* | 2/2019 | Kong | G09G 3/3291 |
| 2019/0130842 A1* | 5/2019 | Jang | G09G 3/3266 |
| 2019/0385533 A1* | 12/2019 | Liu | G09G 3/3266 |
| 2020/0105198 A1* | 4/2020 | Park | G09G 3/3275 |
| 2021/0125547 A1* | 4/2021 | Lin | G09G 3/32 |
| 2021/0287599 A1* | 9/2021 | Kim | G09G 3/32 |
| 2021/0319755 A1* | 10/2021 | Kim | G09G 3/3233 |
| 2022/0270542 A1* | 8/2022 | Park | G09G 3/32 |
| 2023/0075449 A1* | 3/2023 | Ji | G09G 3/3266 |

FOREIGN PATENT DOCUMENTS

| | | |
|---|---|---|
| KR | 10-1889951 B1 | 8/2018 |
| KR | 10-2020-0135633 A | 12/2020 |

\* cited by examiner

DISPLAY APPARATUS

CROSS-REFERENCE TO RELATED APPLICATION

This application claims priority to and the benefit of Korean Patent Application No. 10-2021-0134439, filed on Oct. 8, 2021, in the Korean Intellectual Property Office, the entire disclosure of which is incorporated by reference herein.

BACKGROUND

1. Field

One or more embodiments of the present disclosure relate to a scan driver, and a display apparatus including the same.

2. Description of the Related Art

A display apparatus includes a pixel part, a scan driver, a data driver, and a controller. The pixel part includes a plurality of pixels. The scan driver includes stages connected to scan lines. The stages are configured to supply scan signals to the scan lines connected thereto in response to signals from the controller.

The above information disclosed in this Background section is for enhancement of understanding of the background of the present disclosure, and therefore, it may contain information that does not constitute prior art.

SUMMARY

One or more embodiments of the present disclosure are directed to a display apparatus that may be driven with a variable driving frequency. The display apparatus may include a single scan driver configured to output a scan signal and an emission signal to a pixel, and may minimize or reduce a difference in luminance for each driving frequency by adjusting an output timing of the emission signal from the scan driver according to the driving frequency.

However, the aspects and features of the present disclosure are not limited to those described above, and other aspects and features may be clearly understood by those having ordinary skill in the art from the following description. Further, additional aspects and features may be set forth, in part, in the description that follows, and in part, will be apparent from the description, or may be learned by practicing one or more of the presented embodiments of the present disclosure.

According to one or more embodiments of the present disclosure, a display apparatus includes: a pixel part including a plurality of pixels, each of the plurality of pixels being configured to receive a first scan signal and an emission signal; and a scan driver configured to output the first scan signal and the emission signal to each of the plurality of pixels. In a second driving mode in which the display apparatus is driven with a first driving frequency lower than a maximum driving frequency, the scan driver is configured to supply the first scan signal to the plurality of pixels according to the first driving frequency, and supply the emission signal to the plurality of pixels according to the maximum driving frequency.

In an embodiment, during one frame, each of the plurality of pixels may be configured to be driven in a display period and a blank period, the display period being a period of the one frame in which a data signal may be applied in response to the first scan signal and light may be emitted in response to the data signal, and the blank period being a period in the one frame in which light emission may be maintained. In the second driving mode, the scan driver may be configured to supply the first scan signal once to the plurality of pixels in the display period, and supply the emission signal once to the plurality of pixels in the display period and one or more times in the blank period.

In an embodiment, the scan driver may include a plurality of stages, each of the plurality of stages including: a first signal outputter including: a first pull-up transistor including a gate connected to a first control node, and configured to output the first scan signal having an on voltage; and a first pull-down transistor including a gate connected to a second control node, and configured to output the first scan signal having an off voltage; a second signal outputter including: a second pull-up transistor including a gate connected to the first control node, and configured to output a carry signal having an on voltage; and a second pull-down transistor including a gate connected to the second control node, and configured to output the carry signal having an off voltage; a node controller configured to control a voltage of the first control node to a first voltage for turning on the first pull-up transistor and the second pull-up transistor, or to a second voltage for turning off the first pull-up transistor and the second pull-up transistor; and an inverter connected between the first control node and the second control node, and configured to invert the first voltage of the first control node, and supply the inverted first voltage to the second control node.

In an embodiment, an output of the inverter may be the emission signal.

In an embodiment, the first pull-up transistor may be connected between a first clock input terminal and a first output terminal, the first clock input terminal being configured to receive a first clock signal applied according to the first driving frequency; and the second pull-up transistor may be connected between a second clock input terminal and a second output terminal, the second clock input terminal being configured to receive a second clock signal applied according to the maximum driving frequency.

In an embodiment, the node controller may be configured to alternately control the voltage of the first control node to the first voltage and the second voltage according to the maximum driving frequency.

In an embodiment, the display apparatus may further include a buffer transistor configured to be turned on or turned off in response to an output of the inverter, and when the buffer transistor is turned on, an on voltage may be output as the emission signal.

In an embodiment, the first signal outputter may further include a first capacitor connected between the gate of the first pull-up transistor and the first output terminal.

In an embodiment, the second signal outputter may further include a second capacitor connected between the gate of the second pull-up transistor and the second output terminal.

In an embodiment, each of the plurality of pixels may include: a driving transistor; a second transistor connected between a data line and a gate of the driving transistor, and configured to be turned on or turned off in response to the first scan signal; and a fourth transistor connected to a driving voltage line and one end of the driving transistor, and configured to be turned on or turned off in response to the emission signal, the driving voltage line being configured to supply a first power supply voltage.

In an embodiment, each of the plurality of pixels may further include a third transistor connected between another end of the driving transistor and an initialization voltage line, and configured to be turned on or turned off in response to a second scan signal, the initialization voltage line being configured to supply an initialization voltage; the scan driver may be further configured to supply the second scan signal to the plurality of pixels according to the first driving frequency in the second driving mode; and an on-voltage duration of the first scan signal may overlap with an on-voltage duration of the second scan signal.

According to one or more embodiments of the present disclosure, a display apparatus includes a scan driver including a plurality of stages, each of the plurality of stages including: a first signal outputter including: a first pull-up transistor including a gate connected to a first control node, and configured to output a first scan signal having an on voltage; and a first pull-down transistor including a gate connected to a second control node, and configured to output the first scan signal having an off voltage; a second signal outputter including: a second pull-up transistor including a gate connected to the first control node, and configured to output a carry signal having an on voltage; and a second pull-down transistor including a gate connected to the second control node, and configured to output the carry signal having an off voltage; a node controller configured to control a voltage of the first control node to a first voltage for turning on the first pull-up transistor and the second pull-up transistor, or to a second voltage for turning off the first pull-up transistor and the second pull-up transistor; and an inverter connected between the first control node and the second control node, and configured to invert the first voltage of the first control node, and supply the inverted first voltage to the second control node. In a driving mode in which the display apparatus is driven with a first driving frequency lower than a maximum driving frequency, the scan driver is configured to output the first scan signal according to the first driving frequency, and output an output of the inverter as an emission signal according to the maximum driving frequency.

In an embodiment, one frame may include a display period and a blank period, the display period being a period of the one frame in which a data signal may be applied to a pixel in response to the first scan signal and the pixel emits light in response to the data signal, and the blank period being a period in the one frame in which the pixel may maintain light emission.

In an embodiment, the first pull-up transistor may be connected between a first output terminal and a first clock input terminal configured to receive a first clock signal applied according to the first driving frequency, and the second pull-up transistor may be connected between a second output terminal and a second clock input terminal configured to receive a second clock signal applied according to the maximum driving frequency.

In an embodiment, the first signal outputter may further include a first capacitor connected between the gate of the first pull-up transistor and the first output terminal.

In an embodiment, the second signal outputter may further include a second capacitor connected between the gate of the second pull-up transistor and the second output terminal.

In an embodiment, the node controller may be configured to alternately control the voltage of the first control node to the first voltage and the second voltage according to the maximum driving frequency.

In an embodiment, each of the plurality of stages may further include a buffer transistor configured to be turned on or turned off in response to an output of the inverter, and when the buffer transistor is turned on, an on voltage may be output as the emission signal.

In an embodiment, the display apparatus may further include a pixel part including a plurality of pixels configured to receive the first scan signal and the emission signal, each of the plurality of pixels including: a driving transistor; a second transistor connected between a data line and a gate of the driving transistor, and configured to be turned on or turned off in response to the first scan signal; and a fourth transistor connected to a driving voltage line and one end of the driving transistor, and configured to be turned on or turned off in response to the emission signal, the driving voltage line being configured to supply a first power supply voltage.

In an embodiment, each of the plurality of pixels may further include a third transistor connected between another end of the driving transistor and an initialization voltage line, and configured to be turned on or turned off in response to a second scan signal, the initialization voltage line being configured to supply an initialization voltage; the scan driver may be configured to supply the second scan signal to the plurality of pixels according to the first driving frequency in the driving mode; and an on-voltage duration of the first scan signal may overlap with an on-voltage duration of the second scan signal.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
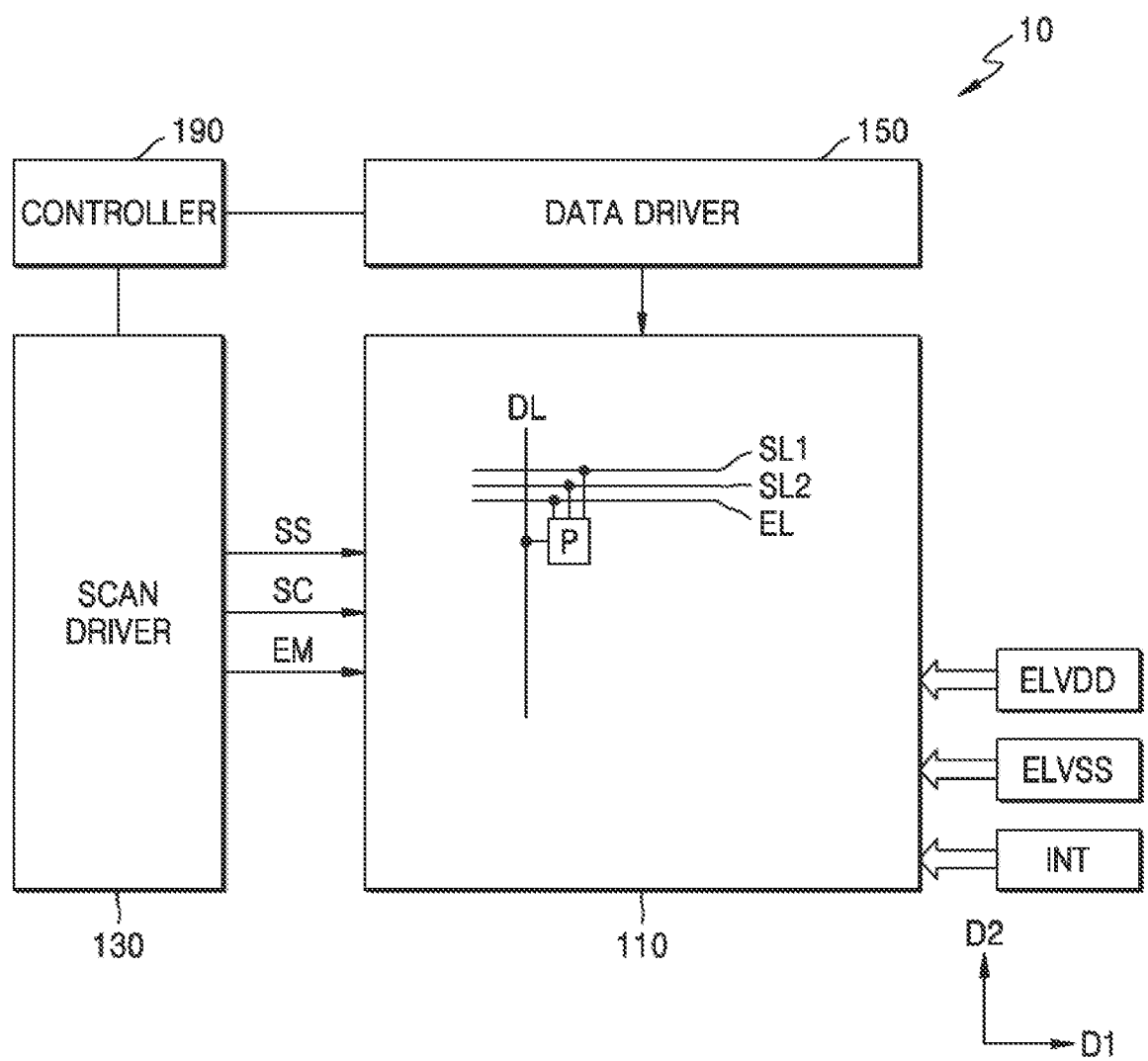
FIG. 1 is a diagram schematically illustrating a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

For example, it will be understood that, when X and Y are referred to as being connected to each other, X and Y may be electrically connected to each other, X and Y may be functionally connected to each other, and/or X and Y may be directly connected to each other. Thus, X and Y may be objects (e.g., devices, elements, circuits, wirings, electrodes, terminals, conductive layers, layers, etc.). Similarly, it will be understood that, when X and Y are referred to as being electrically connected to each other, one or more elements (e.g., switches, transistors, capacitive elements, inductors, resistive elements, diodes, etc.) that enable the electrical connection of X and Y may be connected between X and Y. Therefore, the disclosure is not limited to the specific connection relationships, for example, such as the connection relationships illustrated in the drawings or proposed in the detailed description, and other connection relationships may be included.

As used herein, the terms "on" and "off" in connection with an element state may refer to an activated state of the element and an inactive (or deactivated) state of the element, respectively. The terms "on" and "off" used in connection with a signal received by an element may refer to a signal that activates the element and a signal that deactivates the element, respectively. The element may be activated by a high-level voltage or a low-level voltage. For example, a P-channel transistor is activated by a low-level voltage, and an N-channel transistor is activated by a high-level voltage. Therefore, it may be understood that "on" voltages for the P-channel transistor and the N-channel transistor are opposite (low and high) voltage levels from each other.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a diagram schematically illustrating a display apparatus 10 according to an embodiment.

The display apparatus 10 according to various embodiments may be implemented as a suitable electronic apparatus, for example, such as a smartphone, a mobile phone, a smart watch, a navigation device, a game console, a television (TV), a vehicle head unit, a notebook computer, a laptop computer, a tablet computer, a personal media player (PMP), a personal digital assistant (PDA), and/or the like. In some embodiments, the electronic apparatus may be a flexible apparatus.

Referring to FIG. 1, the display apparatus 10 may include a pixel part 110, a scan driver 130, a data driver 150, and a controller 190.

The pixel part 110 may include a plurality of pixels P connected to a plurality of first scan lines SL1, a plurality of second scan lines SL2, a plurality of data lines DL, and a plurality of emission lines EL.

The pixels P may be arranged in various suitable forms, for example, such as a stripe arrangement, an RGBG arrangement (e.g., a PENTILE® arrangement, PENTILE® being a duly registered trademark of Samsung Display Co., Ltd.), or a mosaic arrangement, and may implement an image. The pixel part 110 may be at (e.g., in or on) a display area of a substrate. Each of the pixels P may include an organic light-emitting diode OLED as a display element, and the organic light-emitting diode OLED may be connected to a pixel circuit. Each of the pixels P may emit, for example, a red light, a green light, a blue light, or a white light from the organic light-emitting diode OLED. Each of the pixels P may be connected to a corresponding first scan line from among the first scan lines SL1, a corresponding second scan line from among the second scan lines SL2, a corresponding emission line from among the emission lines EL, and a corresponding data line from among the data lines DL.

The first scan lines SL1, the second scan lines SL2, and the emission lines EL may extend in a first direction D1 (e.g., a row direction), and may be connected to the pixels P located in the same row as each other. The first scan lines SL1 may be configured to transmit a first scan signal SC to the pixels P located in the same row as each other. The second scan lines SL2 may be configured to transmit a second scan signal SS to the pixels P located in the same row as each other. The emission lines EL may be configured to transmit an emission signal EM to the pixels P located in the same row as each other. In the pixel part 110, the data lines DL may be spaced apart from each other, and may be arranged in columns. The data lines DL may extend in a second direction D2 (e.g., a column direction), and may be connected to the pixels P located in the same column as each other. The data lines DL may be configured to transmit data signals DATA to the pixels P located in the same column as each other.

When the display apparatus 10 is an organic light-emitting display apparatus, a first power supply voltage ELVDD and a second power supply voltage ELVSS may be supplied to the pixels P of the pixel part 110. The first power supply voltage ELVDD may be a high-level voltage (hereinafter referred to as a "high voltage") that is provided to a first electrode (e.g., a pixel electrode or an anode electrode) of the display element included in each of the pixels P. The second power supply voltage ELVSS may be a low-level voltage (hereinafter referred to as a "low voltage") that is provided to a second electrode (e.g., an opposite electrode or a cathode electrode) of the display element included in each of the pixels P. The first power supply voltage ELVDD and the second power supply voltage ELVSS are driving voltages for allowing the pixels P to emit light. In an embodiment, an initialization voltage INT may be further supplied to the pixels P of the pixel part 110.

The scan driver 130 may be connected to the first scan lines SL1, and may be configured to generate the first scan signal SC in response to a control signal from the controller 190 to sequentially supply the first scan signal SC to the first scan lines SL1. The scan driver 130 may be connected to the second scan lines SL2, and may be configured to generate the second scan signal SS in response to the control signal from the controller 190 to sequentially supply the second scan signal SS to the second scan lines SL2. The scan driver 130 may be connected to the emission lines EL, and may be configured to generate the emission signal EM in response to the control signal from the controller 190 to sequentially supply the emission signal EM to the emission lines EL. The first scan signal SC, the second scan signal SS, and the emission signal EM may be pulses including an on voltage at which a transistor included in the pixel P is turned on. The on voltage may be a high voltage or a low voltage, depending on a kind of the transistor.

The data driver 150 may be connected to the data lines DL, and may be configured to supply the data signal to the data lines DL during a display period in response to a control signal from the controller 190. The data signal supplied to the data lines DL may be supplied to the pixels P to which the first scan signal SC are supplied. Thus, the data driver 150 may be configured to supply the data signal to the data lines DL so as to be synchronized or substantially synchronized with the first scan signal SC.

The controller 190 may be configured to generate the control signals based on external signals, and may supply the control signals to the scan driver 130 and the data driver 150. The control signal output to the scan driver 130 may include a plurality of clock signals CK and a scan start signal. The control signal output to the data driver 150 may include a source start signal and clock signals.

The display apparatus 10 may include a display panel, and the display panel may include a substrate. The display apparatus 10 may include a display area at (e.g., in or on) which an image is displayed, and a non-display area outside the display area. For example, the non-display area may surround (e.g., around a periphery of) the display area. The pixel part 110 may be at (e.g., in or on) the display area of the substrate, and driving circuits, for example, such as the scan driver 130 and the data driver 150, may be at (e.g., in or on) the non-display area. For example, all or part of the scan driver 130 may be directly formed at (e.g., in or on) the non-display area of the substrate during a process of forming transistors included in the pixel circuit at (e.g., in or on) the display area of the substrate.

In an embodiment, the data driver 150 may be on a flexible printed circuit board (FPCB) that is electrically connected to a pad at one side of the substrate. In another embodiment, the data driver 150 may be directly on the substrate in a chip on glass (COG) or chip on plastic (COP) manner.

Hereinafter, an organic light-emitting display apparatus will be described in more detail as an example of the display apparatus 10 according to an embodiment, but the present disclosure is not limited thereto. In other embodiments, the display apparatus 10 may include an inorganic light-emitting display (or an inorganic electroluminescence (EL) display), a quantum dot light-emitting display, and/or the like.

Figure 2A:
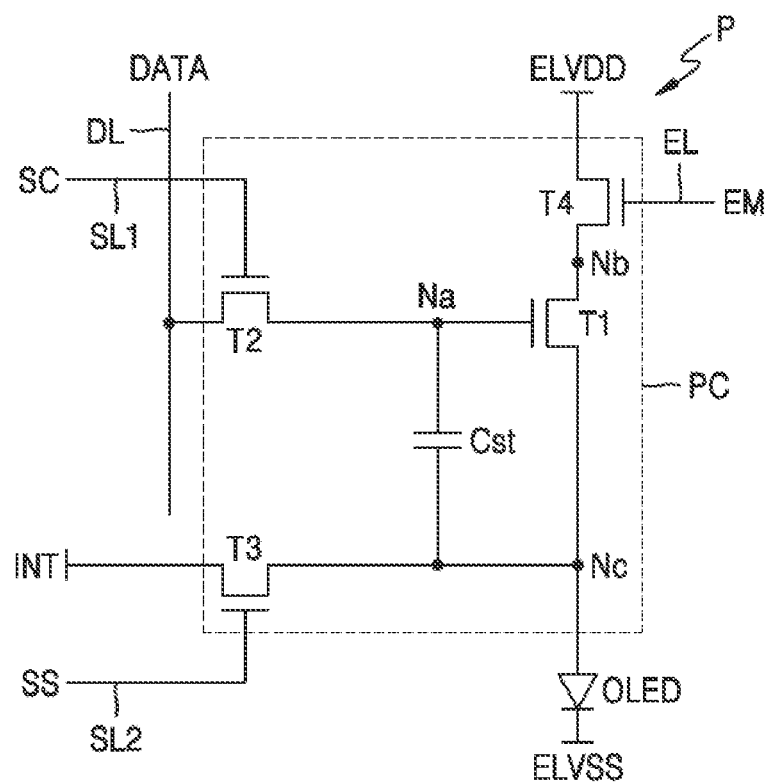
FIGS. 2A-2B are equivalent circuit diagrams illustrating a pixel according to various embodiments.
Figure 2B:
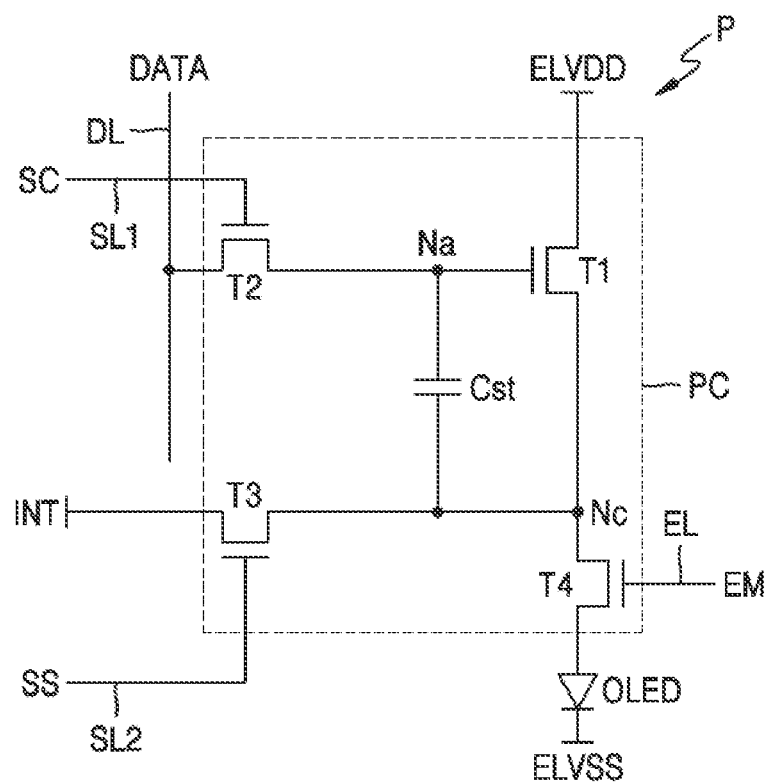

FIGS. 2A and 2B are equivalent circuit diagrams illustrating a pixel according to various embodiments.

Referring to FIG. 2A, each of pixels P may include a pixel circuit PC, and an organic light-emitting diode OLED as a display element connected to the pixel circuit PC. The pixel circuit PC includes a first transistor T1, a second transistor T2, a third transistor T3, a fourth transistor T4, and a capacitor Cst. The first transistor T1 may be a driving transistor, and a source-drain current of the first transistor T1 may be determined according to a gate-source voltage thereof. Each of the second to fourth transistors T2 to T4 may be a switching transistor that is turned on or turned off according to a gate voltage thereof.

The first transistor T1 includes a gate connected to a first node Na, a first terminal connected to a second node Nb, and a second terminal connected to a third node Nc. The first terminal of the first transistor T1 may be connected to a driving voltage line via the fourth transistor T4, the driving voltage line being configured to supply the first power supply voltage ELVDD. The second terminal of the first transistor T1 may be connected to a first electrode (e.g., a pixel electrode) of the organic light-emitting diode OLED. The first transistor (e.g., the driving transistor) T1 may be configured to receive a data signal DATA according to a switching operation of the second transistor T2, and may control an amount of a driving current flowing to the organic light-emitting diode OLED.

The second transistor T2 (e.g., a data write transistor) includes a gate connected to a first scan line SL1, a first terminal connected to a data line DL, and a second terminal connected to the first node Na (e.g., connected to the gate of the first transistor T1). The second transistor T2 may be configured to be turned on in response to a first scan signal SC supplied through the first scan line SL1 to electrically connect the data line DL to the first node Na, and to transmit to the first node Na, the data signal DATA supplied through the data line DL.

The third transistor T3 (e.g., an initialization transistor) includes a gate connected to a second scan line SL2, a first terminal connected to the third node Nc (e.g., connected to the second terminal of the first transistor T1), and a second terminal connected to an initialization voltage line configured to supply an initialization voltage INT. The third transistor T3 may be configured to be turned on in response to a second scan signal SS supplied through the second scan line SL2 to transmit, to the third node Nc, the initialization voltage INT transmitted through the initialization voltage line.

The fourth transistor T4 (e.g., an emission control transistor) includes a gate connected to an emission line EL, a first terminal connected to the driving voltage line, and a second terminal connected to the second node Nb (e.g., connected to the first terminal of the first transistor T1). The fourth transistor T4 is turned on in response to an emission signal EM transmitted through the emission line EL, so that a current flows through the organic light-emitting diode OLED.

The capacitor Cst may be connected between the first node Na and the second terminal of the first transistor T1. The capacitor Cst may store a voltage corresponding to a difference between a voltage received from the second transistor T2 and a voltage at the second terminal of the first transistor T1.

The organic light-emitting diode OLED may include the first electrode (e.g., the pixel electrode) connected to the second terminal of the first transistor T1, and a second electrode (e.g., an opposite electrode) to which the second power supply voltage ELVSS, which may be a common voltage, is applied. The organic light-emitting diode OLED may emit light having a desired luminance (e.g., a predetermined luminance) according to the driving current supplied from the first transistor T1.

In another embodiment, the fourth transistor T4 may be connected between the first transistor T1 and the organic light-emitting diode OLED. For example, in the pixel circuit PC illustrated in FIG. 2B, the fourth transistor T4 may include a gate connected to the emission line EL, a first terminal connected to the third node Nc, and a second electrode connected to the first electrode of the organic light-emitting diode OLED.

Although FIGS. 2A and 2B illustrate that the transistors of the pixel circuit PC are N-type transistors, the present disclosure is not limited thereto, and various modifications may be possible as would be understood by those having ordinary skill in the art. For example, all of the transistors of the pixel circuit PC may be P-type transistors. As another example, some transistors of the pixel circuit PC may be P-type transistors, and other transistors of the pixel circuit PC may be N-type transistors.

In some embodiments, at least the first transistor T1 may be an oxide semiconductor thin-film transistor that includes an active layer including an amorphous or crystalline oxide semiconductor. For example, the first to fourth transistors T1 to T4 may be oxide semiconductor thin-film transistors. The oxide semiconductor thin-film transistor has excellent off-current characteristics. As another example, in some embodiments, at least one of the first to fourth transistors T1 to T4 may be a low temperature poly-silicon (LTPS) thin-film transistor that includes an active layer including poly-silicon. The LTPS thin-film transistor has high electron mobility, and accordingly, has fast driving characteristics.

Figure 3:
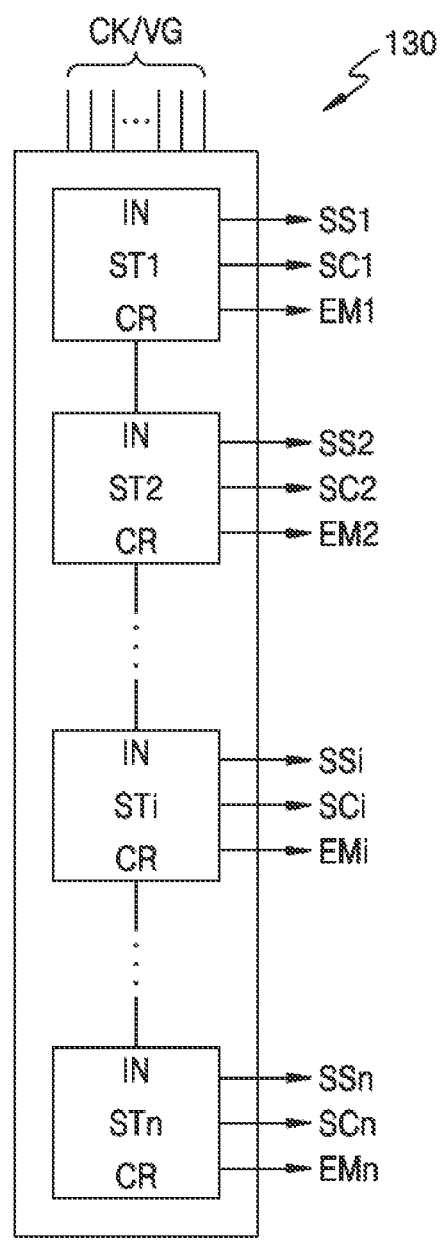
FIG. 3 is a diagram schematically illustrating a scan driver according to an embodiment.

FIG. 3 is a diagram schematically illustrating a scan driver 130 according to an embodiment.

Referring to FIG. 3, the scan driver 130 may include a plurality of stages including first to n-th stages ST1 to STn, where n is a natural number greater than 1. The first to n-th stages ST1 to STn may be configured to sequentially output first scan signals SC1 to SCn and second scan signals SS1 to SSn to the first scan lines SL1 and the second scan lines SL2 during one frame period. The first to n-th stages ST1 to STn may be configured to sequentially output emission signals EM1 to EMn to the emission lines EL during one frame period.

Each of the first to n-th stages ST1 to STn may be connected to a corresponding one of the first scan lines SL1, a corresponding one of the second scan lines SL2, and a corresponding one of the emission lines EL. Each of the first to n-th stages ST1 to STn may be configured to receive at least one clock signal CK and at least one voltage signal VG, supply the first scan signal SC through the connected (e.g., the corresponding) first scan line SL1, supply the second scan signal SS to the connected (e.g., the corresponding) second scan line SL2, and supply the emission signal EM to the connected (e.g., the corresponding) emission line EL. For example, an i-th stage STi (where i is a natural number between 1 and n) may be configured to supply a first scan signal SCi to a first scan line SL1 of an i-th row, supply a second scan signal SSi to a second scan line SL2 of the i-th row, and supply an emission signal EMi to an emission line EL of the i-th row. In other words, each of the first to n-th stages ST1 to STn may be configured to supply the first scan signal SC, the second scan signal SS, and the emission signal EM to corresponding ones of the first scan line SL1, the second scan line SL2, and the emission line EL, which are provided in the same row as each other.

Each of the first to n-th stages ST1 to STn may be configured to supply a carry signal CR to a preceding stage or a subsequent stage in response to one of carry clock signals. The preceding stage may be at least one previous stage, and the subsequent stage may be at least one next stage.

In some embodiments, at least one dummy stage may be further provided at a front end of the first stage ST1 that is the first stage from among the first to n-th stages ST1 to STn, and at least one dummy stage may be further provided at a rear end of the n-th stage STn that is the last stage from among the first to n-th stages ST1 To STn. The at least one dummy stage may not be connected to the first scan line, the second scan line, and the emission line.

Figure 4:
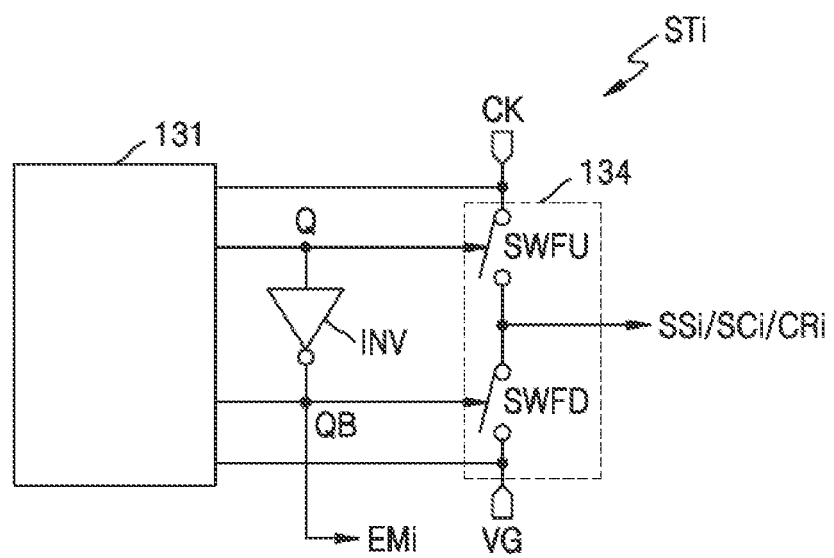
FIG. 4 is a diagram schematically illustrating a stage included in the scan driver according to an embodiment.

FIG. 4 is a diagram schematically illustrating the i-th stage STi included in the scan driver 130 of FIG. 3, according to an embodiment.

Referring to FIG. 4, the i-th stage STi may include a node controller 131 configured to control a first control node Q, an inverter INV configured to invert a voltage of the first control node Q and to supply the inverted voltage to a second control node QB, and an output controller 134. The node controller 131 and the inverter INV may include at least one transistor and at least one capacitor.

The output controller 134 may include a pull-up transistor SWFU configured to output a high voltage, and a pull-down transistor SWFD configured to output a low voltage. When the pull-up transistor SWFU is turned on, a high voltage signal may be output based on a clock signal CK. The pull-up transistor SWFU may include a first pull-up transistor configured to output a first scan signal SCi of a high voltage, a second pull-up transistor configured to output a second scan signal SSi of a high voltage, and a third pull-up transistor configured to output a carry signal CRi of a high voltage. When the pull-down transistor SWFD is turned on, a low voltage signal may be output based on a voltage signal VG. The pull-down transistor SWFD may include a first pull-down transistor configured to output a first scan signal SCi of a low voltage, a second pull-down transistor configured to output a second scan signal SSi of a low voltage, and a third pull-down transistor configured to output a carry signal CRi of a low voltage. An output of the inverter INV, or in other words, a voltage of the second control node QB, may be output as an emission signal EMi.

Figure 5:
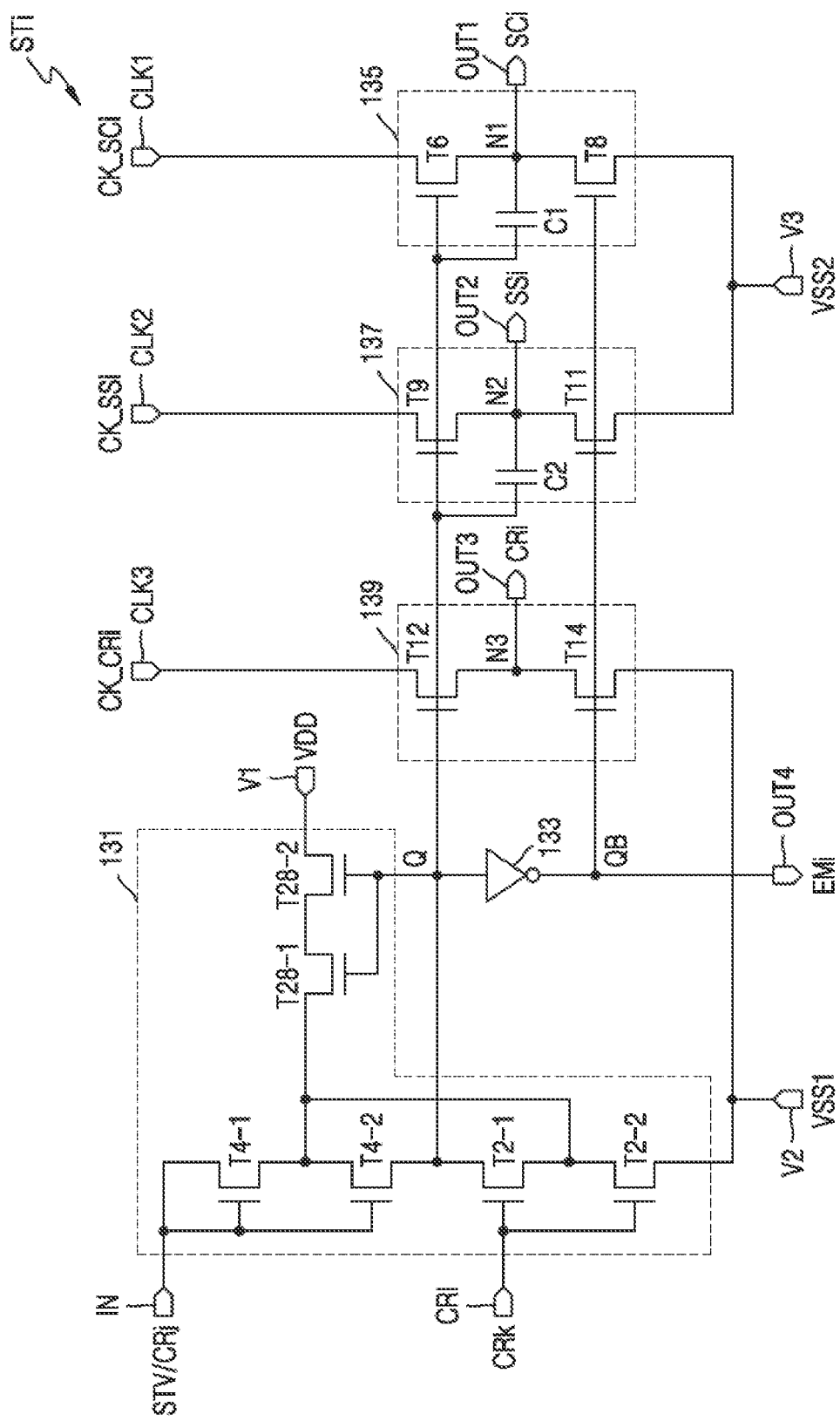
FIG. 5 is a diagram schematically illustrating a portion of the stage according to an embodiment.

FIG. 5 is a diagram schematically illustrating a portion of the stage STi according to an embodiment.

Each of the first to n-th stages ST1 to STn includes a plurality of nodes. Hereinafter, some nodes are referred to as first to third output nodes N1 to N3, and first and second nodes Q and QB. Hereinafter, the i-th stage STi configured to output the first scan signal SCi, the second scan signal SSi, and the emission signal EMi to the i-th row of the pixel part 110 will be described in more detail as an example.

A first clock signal CK_SCi, a second clock signal CK_SSi, and a third clock signal CK_CRi may be supplied to the i-th stage STi. The first clock signal CK_SCi, the second clock signal CK_SSi, and the third clock signal CK_CRi may be a square wave signal that repeats a high voltage and a low voltage. A high voltage duration may be set to be shorter than a low voltage duration. The high voltage duration corresponds to a width of the scan signal, and may be variously set according to a structure of the pixel circuit PC. The widths of the first scan signal SCi and the second scan signal SSi may be an on-voltage duration. The width of the emission signal EMi may be an off-voltage duration.

The i-th stage STi may include a node controller 131, an inverter 133, a first output controller 135, a second output controller 137, and a third output controller 139.

The node controller 131 may be connected between a first voltage input terminal V1 and a second voltage input terminal V2. The node controller 131 may be configured to control a voltage of the first control node Q based on a start signal (e.g., an external signal STV or a j-th carry signal CRj) applied to an input terminal IN, a k-th carry signal CRk applied to a carry input terminal CRI, a first voltage VDD applied to the first voltage input terminal V1, and a second voltage VSS1 applied to the second voltage input terminal V2. Each of the j-th carry signal CRj and the k-th carry signal CRk may be a carry signal of a preceding stage or a carry signal of a subsequent stage. The preceding stage may be at least one previous stage, and the subsequent stage may be at least one next stage. A high voltage duration of the j-th carry signal CRj may not overlap with a high voltage duration of the k-th carry signal CRk. The first voltage VDD may be, for example, an on voltage that turns on a transistor. The second voltage VSS1 is a voltage lower than the first voltage VDD. For example, the second voltage VSS1 may be an off voltage. The node controller 131 may include a second transistor, a fourth transistor, and a twenty-eighth transistor.

The second transistor may include a (2-1)th transistor T2-1 and a (2-2)th transistor T2-2 that are connected in series with each other between the first control node Q and the second voltage input terminal V2. Gates of the (2-1)th transistor T2-1 and the (2-2)th transistor T2-2 may be connected to the carry input terminal CRI. When the k-th carry signal CRk of the high voltage is supplied to the (2-1)th transistor T2-1 and the (2-2)th transistor T2-2, the (2-1)th transistor T2-1 and the (2-2)th transistor T2-2 may be turned on to set the voltage of the first control node Q to the second voltage VSS1.

The fourth transistor may include a (4-1)th transistor T4-1 and a (4-2)th transistor T4-2 that are connected in series with each other between the first control node Q and the input terminal IN. Gates of the (4-1)th transistor T4-1 and the (4-2)th transistor T4-2 may be connected to the input terminal IN. The (4-1)th transistor T4-1 and the (4-2)th transistor T4-2 may be turned on in response to the start signal STV/CRj of the high voltage supplied to the input terminal IN, so that the start signal STV/CRj is supplied to the first control node Q.

An intermediate node (e.g., a common electrode) between the (2-1)th transistor T2-1 and the (2-2)th transistor T2-2, and an intermediate node (e.g., a common electrode) between the (4-1)th transistor T4-1 and the (4-2)th transistor T4-2 may each be connected to the twenty-eighth transistor.

The twenty-eighth transistor may include a (28-1)th transistor T28-1 and a (28-2)th transistor T28-2 that are connected in series with each other between the first voltage input terminal V1 and the intermediate nodes of the second and fourth transistors. Gates of the (28-1)th transistor T28-1 and the (28-2)th transistor T28-2 may be connected to the first control node Q. The (28-1)th transistor T28-1 and the (28-2)th transistor T28-2 may be turned on or turned off in response to the voltage of the first control node Q. When the first control node Q is at a high voltage, the twenty-eighth transistor may be turned on so that the intermediate nodes of the second and fourth transistors are maintained or substantially maintained at a high level, thereby minimizing or reducing current leakage of the first control node Q.

The first control node Q may be set (e.g., may be pre-charged) to a high voltage by the start signal STV/CRj, and may be set (e.g., may be discharged) to a low voltage by the k-th carry signal CRk.

The inverter 133 may be connected between the first control node Q and the second control node QB. The inverter 133 may be configured to invert the voltage of the first control node Q, and supply the inverted voltage to the second control node QB. The inverter 133 may include at least one transistor. The voltage of the second control node QB may be output through a fourth output terminal OUT4 as the emission signal EMi.

The first output controller 135 may be configured to output the first clock signal CK_SCi or a third voltage VSS2 to a first output terminal OUT1 connected to the first output node N1 according to the voltages of the first control node Q and the second control node QB. The third voltage VSS2 may be set to be lower than the second voltage VSS1. The first output controller 135 may include a sixth transistor T6 and an eighth transistor T8 that are connected between a first clock input terminal CLK1 and a third voltage input terminal V3. The first output controller 135 may further include a first capacitor C1.

The sixth transistor T6 may be connected between the first clock input terminal CLK1 and the first output terminal OUT1. A gate of the sixth transistor T6 may be connected to the first control node Q. The sixth transistor T6 may be turned on or turned off in response to the voltage of the first control node Q. The sixth transistor T6 may be a first pull-up transistor. When the first control node Q is set to a high voltage, the sixth transistor T6 may be turned on so that the first clock signal CK_SCi of the high voltage is output as the high voltage of the first scan signal SCi.

The eighth transistor T8 may be connected between the first output terminal OUT1 and the third voltage input terminal V3. A gate of the eighth transistor T8 may be connected to the second control node QB. The eighth transistor T8 may be turned on or off in response to the voltage of the second control node QB. The eighth transistor T8 may be a first pull-down transistor. When the second control node QB is set to a high voltage, the eighth transistor T8 may be turned on so that the third voltage VSS2 is output as the low voltage of the first scan signal SCi.

The first capacitor C1 may be connected between the first output node N1 and the first control node Q. When the first control node Q is charged to a high voltage, the sixth transistor T6 may be turned on so that the first clock signal CK_SCi of the high voltage is output as the high voltage of the first scan signal SCi. In this case, the voltage of the first control node Q may be bootstrapped by the first capacitor C1 (e.g., see FIGS. 8A and 8B).

The second output controller 137 may be configured to output the second clock signal CK_SSi or the third voltage VSS2 to a second output terminal OUT2 connected to the second output node N2 according to the voltages of the first control node Q and the second control node QB. The second output controller 137 may include a ninth transistor T9 and an eleventh transistor T11 that are connected between a second clock input terminal CLK2 and the third voltage input terminal V3. The second output controller 137 may further include a second capacitor C2.

The ninth transistor T9 may be connected between the second clock input terminal CLK2 and the second output terminal OUT2. A gate of the ninth transistor T9 may be connected to the first control node Q. The ninth transistor T9 may be turned on or turned off in response to the voltage of the first control node Q. The ninth transistor T9 may be a second pull-up transistor. When the first control node Q is set to a high voltage, the ninth transistor T9 may be turned on so that the second clock signal CK_SSi of the high voltage is output as the high voltage of the second scan signal SSi.

The eleventh transistor T11 may be connected between the second output terminal OUT2 and the third voltage input terminal V3. A gate of the eleventh transistor T11 may be connected to the second control node QB. The eleventh transistor T11 may be turned on or turned off in response to the voltage of the second control node QB. The eleventh transistor T11 may be a second pull-down transistor. When the second control node QB is set to a high voltage, the eleventh transistor T11 may be turned on so that the third voltage VSS2 is output as the low voltage of the second scan signal SSi.

The second capacitor C2 may be connected between the second output node N2 and the first control node Q. When the first control node Q is charged to a high voltage, the ninth transistor T9 may be turned on so that the second clock signal CK_SSi is output as the high voltage of the second scan signal SSi. In this case, the voltage of the first control node Q may be bootstrapped by the second capacitor C2 (e.g., see FIGS. 8A and 8B).

The third output controller 139 may be configured to output the third clock signal CK_CRi or the second voltage VSS1 to a third output terminal OUT3 connected to the third output node N3 according to the voltages of the first control node Q and the second control node QB. The third output controller 139 may include a twelfth transistor T12 and a fourteenth transistor T14 that are connected between a third clock input terminal CLK3 and the second voltage input terminal V2.

The twelfth transistor T12 may be connected between the third clock input terminal CLK3 and the third output terminal OUT3. A gate of the twelfth transistor T12 may be connected to the first control node Q. The twelfth transistor T12 may be turned on or turned off in response to the voltage of the first control node Q. The twelfth transistor T12 may be a third pull-up transistor. When the first control node Q is set to a high voltage, the twelfth transistor T12 may be turned on so that the third clock signal CK_CRi of the high voltage is output as the high voltage of the carry signal CRi.

The fourteenth transistor T14 may be connected between the third output terminal OUT3 and the second voltage input terminal V2. A gate of the fourteenth transistor T14 may be connected to the second control node QB. The fourteenth transistor T14 may be turned on or turned off in response to the voltage of the second control node QB. The fourteenth transistor T14 may be a third pull-down transistor. When the second control node QB is set to a high voltage, the fourteenth transistor T14 may be turned on so that the second voltage VSS1 is output as the low voltage of the carry signal CRi.

Figure 6A:
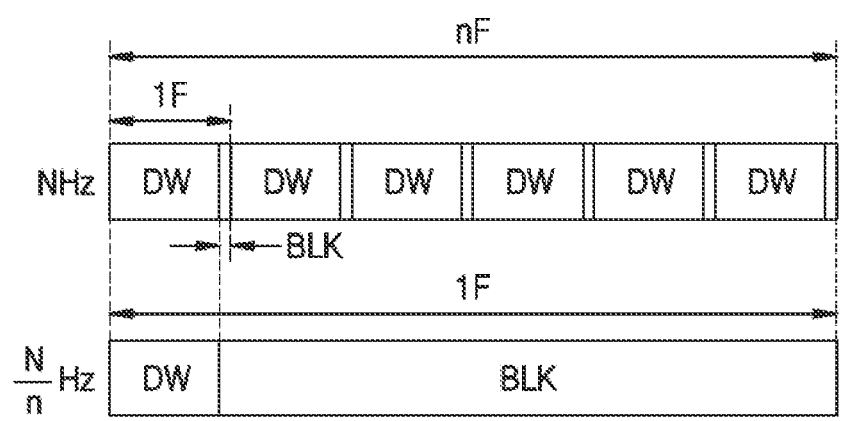
FIGS. 6A-6C are conceptual diagrams illustrating a method of driving a display apparatus according to a driving frequency, according to an embodiment.
Figure 6B:
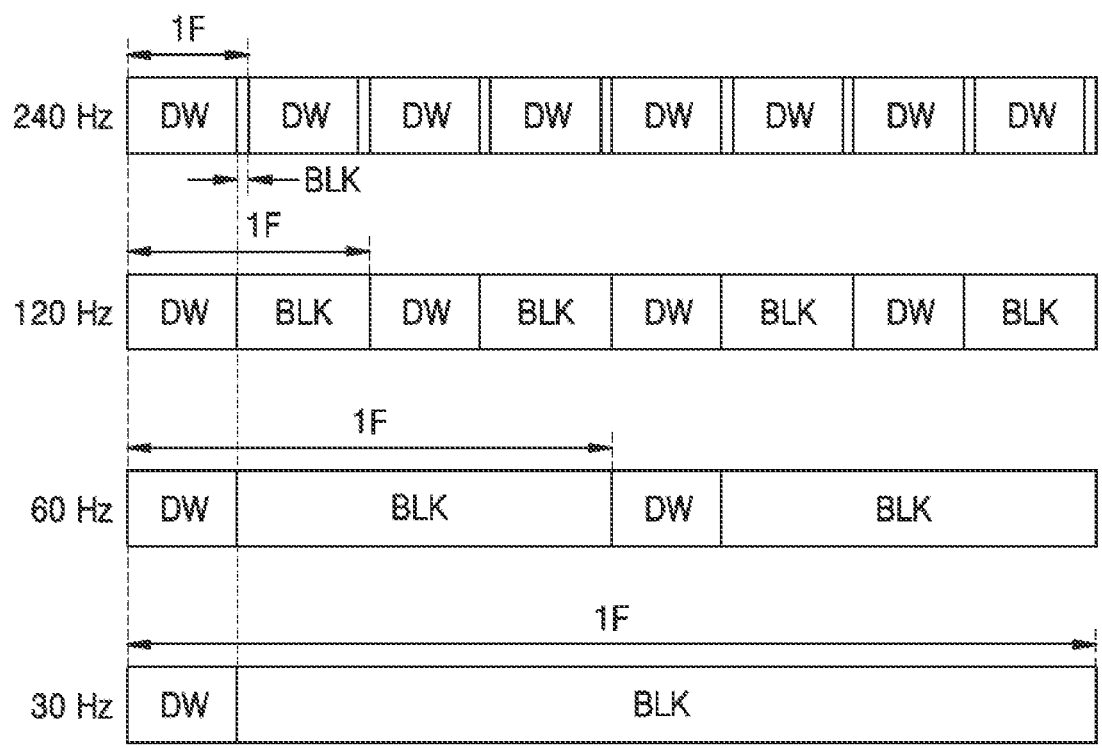
Figure 6C:
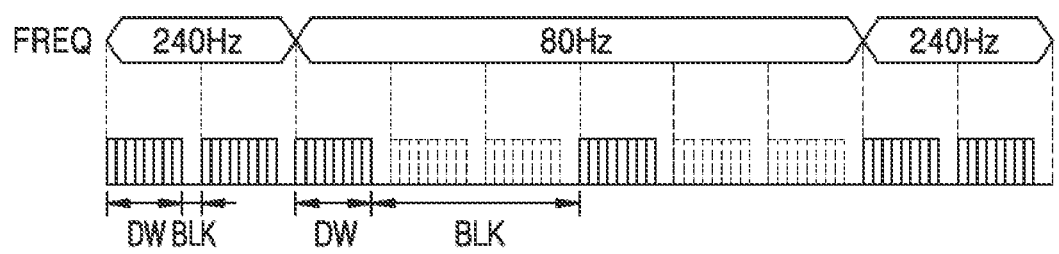

FIGS. 6A to 6C are conceptual diagrams illustrating a method of driving the display apparatus 10 of FIG. 1 according to a driving frequency, according to an embodiment.

The display apparatus 10 according to the present embodiment may support a variable refresh rate (VRR). The display apparatus 10 may be driven with a variable frequency to change a driving frequency within a range of a maximum driving frequency and a minimum driving frequency. Hereinafter, a mode in which the display apparatus 10 operates with the maximum driving frequency is referred to as a normal mode (e.g., a first driving mode), and a mode in which the display apparatus 10 operates with a driving frequency (e.g., a first driving frequency) lower than the maximum driving frequency is referred to as a low-speed driving mode (e.g., a second driving mode). The display apparatus 10 may operate in the low-speed driving mode so as to reduce power consumption. For example, when an operation control signal (e.g., a signal input from a keyboard) is not input for a predetermined time, or when a still image is displayed, the display apparatus 10 may operate in the low-speed driving mode. Each of the pixels P of the display apparatus 10 may be driven in the first driving mode or the second driving mode. The pixel part 110 may display an image at the maximum driving frequency in the first driving mode, and may display an image at the first driving frequency in the second driving mode.

The display apparatus 10 may be driven in a display period DW in which an image is displayed, and a vertical blank period BLK during one frame. The display period DW may be a period in which the data signal is applied to the pixels P of the pixel part 110, and the pixels P display a desired image (e.g., a predetermined image) corresponding to the data signal. The vertical blank period BLK may be a period in which the pixel P maintains or substantially maintains light emission, but the data signal is not applied. In an embodiment, pixel sensing, for example, such as threshold voltage, mobility, and/or deterioration information, of the driving transistor and/or the organic light-emitting diode may be performed during the vertical blank period BLK. The display apparatus 10 may perform the pixel sensing by turning on the third transistor T3 of the pixel P during the vertical blank period BLK.

The display apparatus 10 may be driven with a variable frequency by adjusting the vertical blank period BLK. FIG. 6A illustrates an example in which the maximum driving frequency is N Hz, where N is a natural number, and the first driving frequency is N/n Hz (where n is greater than or equal to 2). In this case, the length of one frame 1F in the second driving mode is n times the length of one frame 1F in the first driving mode. During one frame 1F, the length of the display period DW in the first driving mode is equal to the length of the display period DW in the second driving mode, and the vertical blank period BLK in the second driving mode is greater than the vertical blank period BLK in the first driving mode.

FIG. 6B illustrates an example in which the maximum driving frequency is 240 Hz, and the first driving frequency is lowered to 120 Hz, 60 Hz, and 30 Hz. The length of one frame 1F in the second driving mode is greater than the length of one frame 1F in the first driving mode. During one frame 1F, the length of the display period DW in the first driving mode is equal to the length of the display period DW in the second driving mode, regardless of the driving frequency, and the vertical blank period BLK in the second driving mode is greater than the vertical blank period BLK in the first driving mode. As the first driving frequency decreases, the length of one frame 1F increases and the vertical blank period BLK increases.

As illustrated in FIG. 6C, the display apparatus 10 may be driven with a variable frequency by adjusting the vertical blank period BLK from the first driving mode to the second driving mode, and from the second driving mode to the first driving mode.

Figure 7:
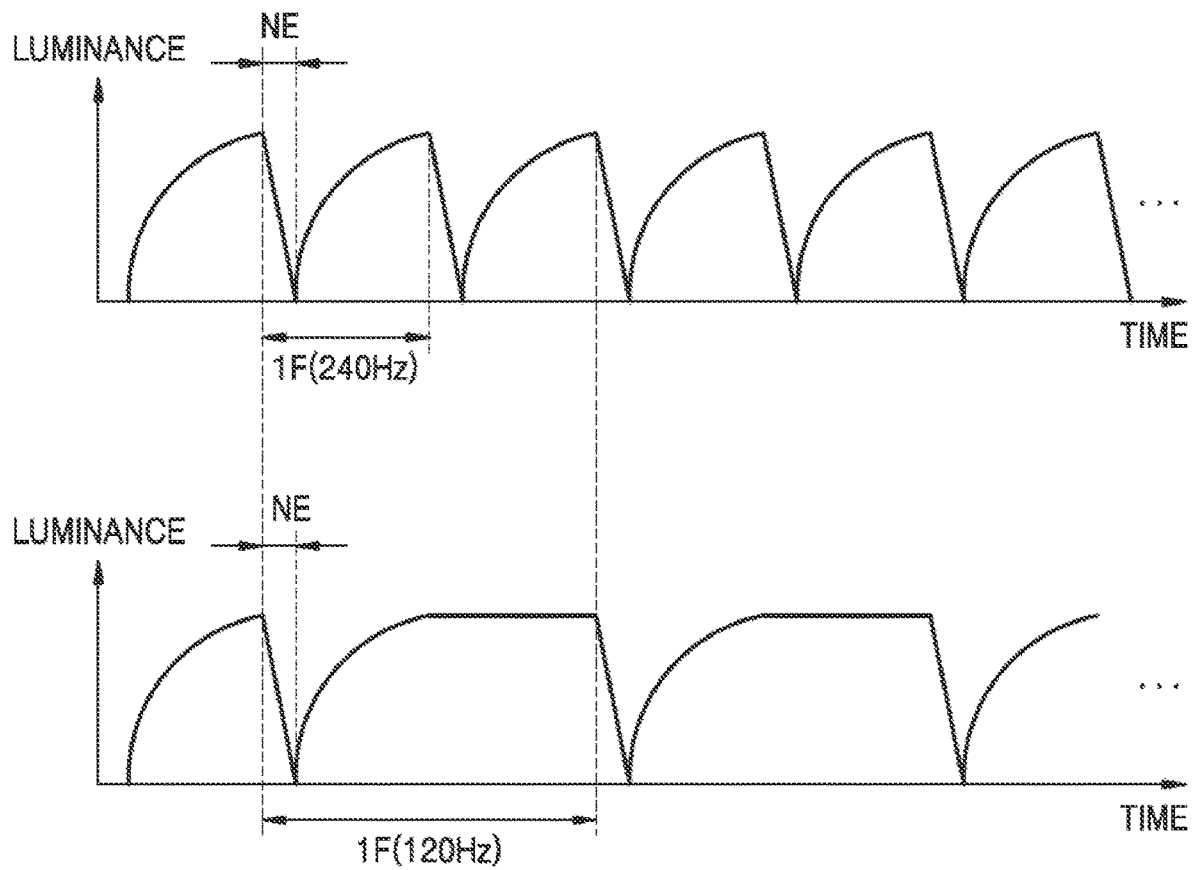
FIG. 7 is a diagram illustrating an example of an optical waveform obtained by measuring a luminance of a display apparatus.

FIG. 7 is a diagram illustrating an example of an optical waveform obtained by measuring a luminance of a display apparatus. An upper graph of FIG. 7 is an example of a change in the luminance of an optical waveform measured in a display apparatus driven in a first driving mode. A lower graph of FIG. 7 is an example of a change in the luminance of an optical waveform measured in a display apparatus driven in a second driving mode. A case in which a maximum driving frequency is 240 Hz and a first driving frequency is 120 Hz will be described in more detail as a non-limiting example.

In general, a capacitor of an organic light-emitting diode may be charged for a predetermined amount of time (e.g., a certain time) until a threshold voltage for light emission is reached. Thus, a non-emission time NE may occur. Therefore, as illustrated in FIG. 7, one non-emission time NE occurs during one frame in the second driving mode of 120 Hz, and two non-emission times NE occurs for the same length of time in the first driving mode of 240 Hz. In other words, the non-emission time NE occurring in the first driving mode is longer than the non-emission time NE occurring in the second driving mode for the same length of time. Therefore, a difference in luminance may occur between the 240 Hz driving and the 120 Hz driving.

Figure 8A:
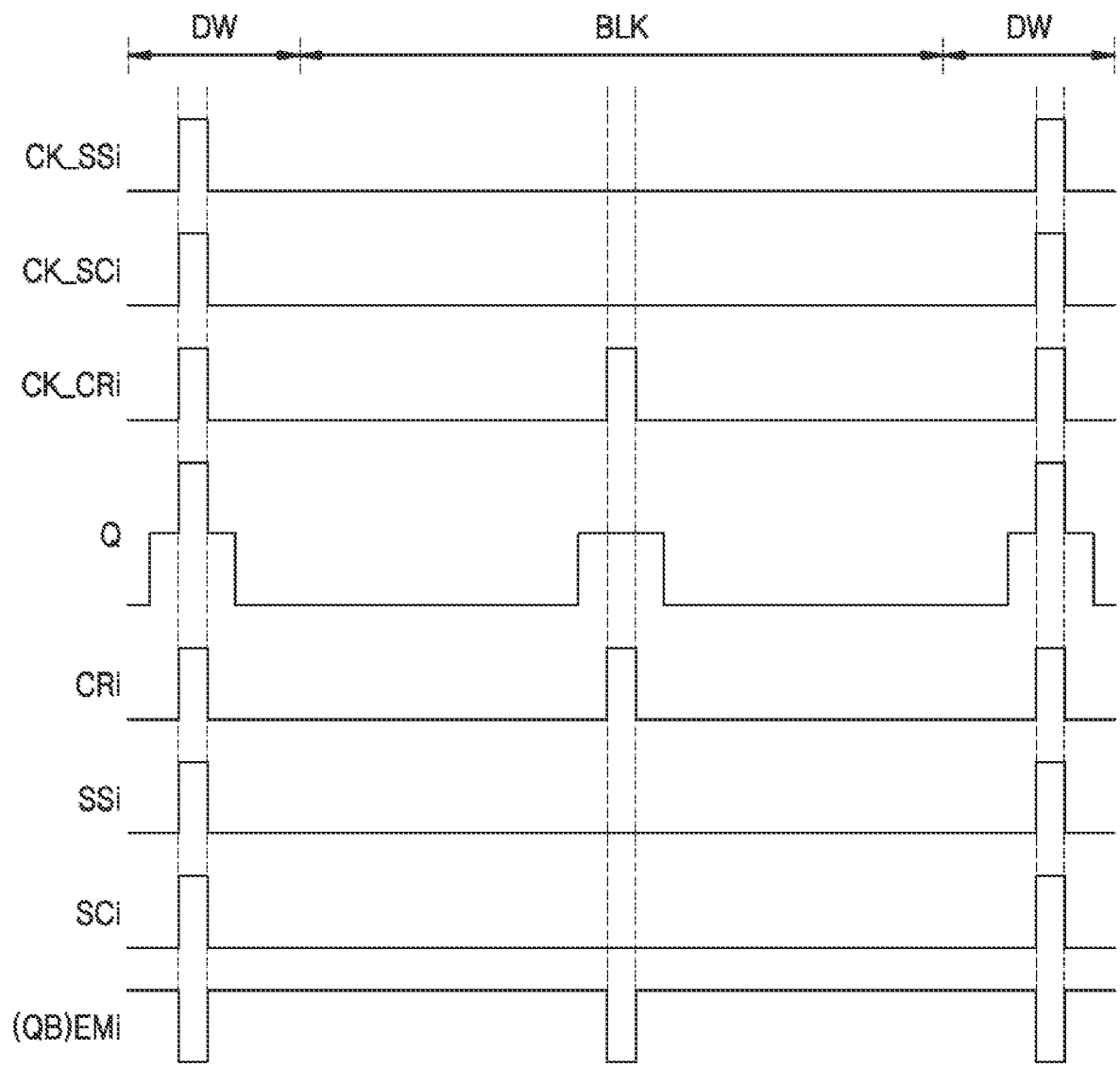
FIGS. 8A-8B are timing diagrams of control signals in a second driving mode according to one or more embodiments.
Figure 8B:
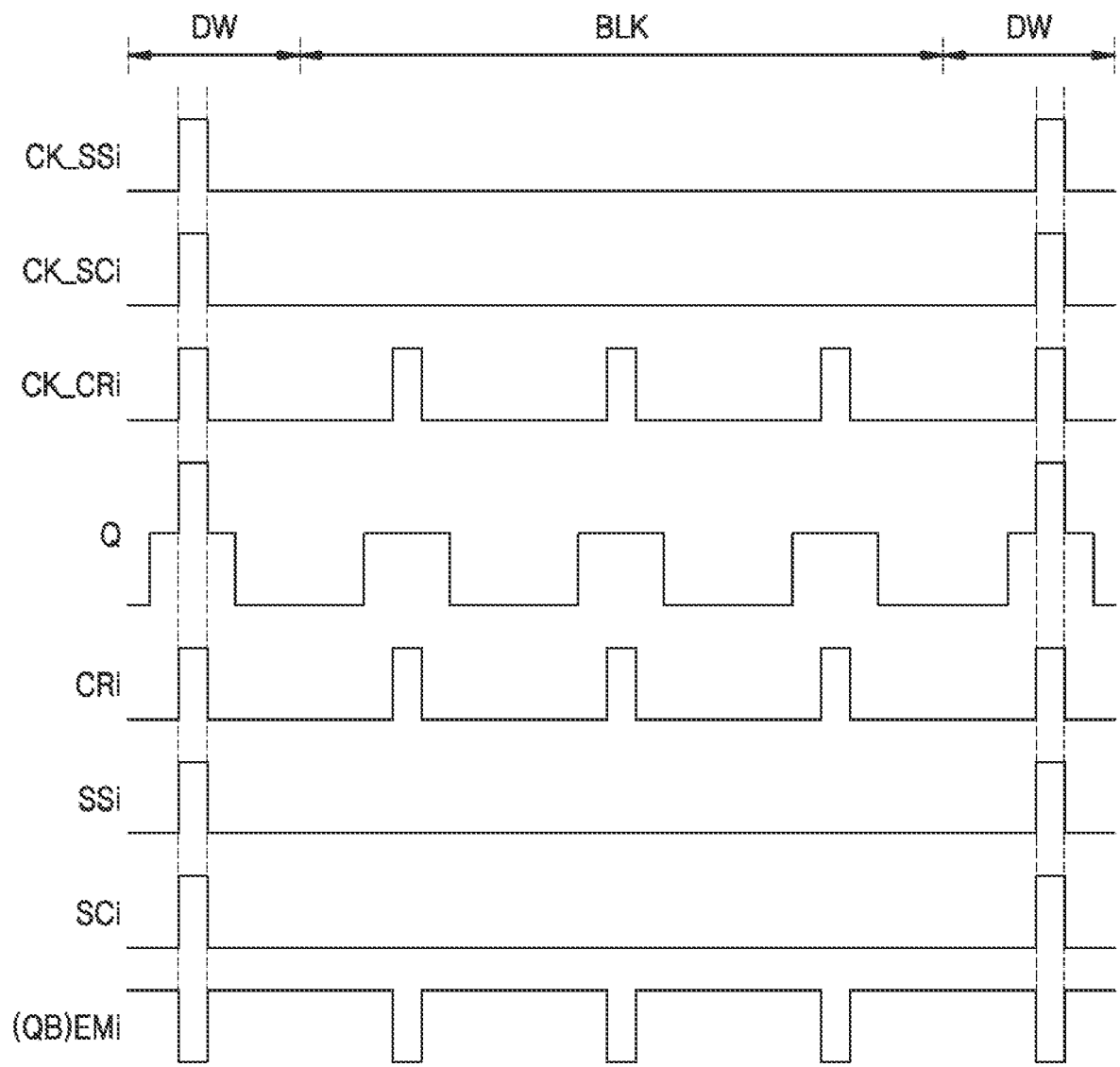

FIGS. 8A and 8B are timing diagrams of control signals in the second driving mode according to one or more embodiments. Hereinafter, FIGS. 8A and 8B will be described in more detail together with reference to FIGS. 1 to 7.

In the first driving mode, the controller 190 may supply the first clock signal CK_SCi, the second clock signal CK_SSi, and the third clock signal CK_CRi to the scan driver 130 according to the maximum driving frequency. In the first driving mode, the scan driver 130 may supply the first scan signal SCi, the second scan signal SSi, and the emission signal EMi to the pixel part 110 according to the maximum driving frequency.

In the second driving mode, the controller 190 may supply the first clock signal CK_SCi and the second clock signal CK_SSi to the scan driver 130 according to the first driving frequency, and may supply the third clock signal CK_CRi to the scan driver 130 according to the maximum driving frequency. In the second driving mode, the scan driver 130 may supply the first scan signal SCi and the second scan signal SSi to the pixel part 110 according to the first driving frequency, and may supply the emission signal EMi to the pixel part 110 according to the maximum driving frequency.

FIG. 8A illustrates an example of the second driving mode in which the maximum driving frequency of the display apparatus is 240 Hz, and the display apparatus is driven with the driving frequency of 120 Hz. Referring to FIG. 8A, the first clock signal CK_SCi and the second clock signal CK_SSi may be supplied to each stage of the scan driver 130 once in the display period DW according to the first driving frequency of 120 Hz, and the third clock signal CK_CRi may be supplied to each stage of the scan driver 130 once in the display period DW and once during the vertical blank period BLK according to the maximum driving frequency of 240 Hz. As used herein, supplying the clock signal may refer to supplying an on voltage (e.g., a high voltage), instead of supplying an off voltage (e.g., a low voltage).

In the display period DW, the start signal of the high voltage may be supplied to the input terminal IN, the node controller 131 may set the first control node Q to the high voltage, the first output controller 135 may output the first clock signal CK_SCi of the high voltage as the first scan signal SCi, the second output controller 137 may output the second clock signal CK_SSi of the high voltage as the second scan signal SSi, and the third output controller 139 may output the third clock signal CK_CRi of the high voltage as the carry signal CRi. The second control node QB may be set to the low voltage by the inverter (INV) 133, and the emission signal EMi of the low voltage may be output through the fourth output terminal OUT4. The second transistor T2 of each of the pixels P receives the data signal in response to the first scan signal SCi of the high voltage. During that time, the fourth transistor T4 is turned off in response to the emission signal EMi of the low voltage, and the organic light-emitting diode OLED does not emit light.

Thereafter, when the first control node Q is changed to the low voltage, the first output controller 135 may output the third voltage VSS2 of the low voltage as the first scan signal SCi, the second output controller 137 may output the third voltage VSS2 of the low voltage as the second scan signal SSi, and the third output controller 139 may output the second voltage VSS1 of the low voltage as the carry signal CRi. The second control node QB may be set to the high voltage by the inverter (INV) 133, and the emission signal EMi of the high voltage may be output through the fourth output terminal OUT4. The second transistor T2 of each of the pixels P is turned off in response to the first scan signal SCi of the low voltage, the fourth transistor T4 is turned on in response to the emission signal EMi of the high voltage, and the organic light-emitting diode OLED emits light according to the driving current output from the first transistor T1.

In the vertical blank period BLK, the first clock signal CK_SCi and the second clock signal CK_SSi maintain or substantially maintain the low voltage, but the third clock signal CK_CRi may be supplied as the high voltage in a portion of the vertical blank period BLK. The start signal of the high voltage may be supplied to the input terminal IN, and the node controller 131 may set the first control node Q to the high voltage. The first output controller 135 may output the first clock signal CK_SCi of the low voltage as the first scan signal SCi, the second output controller 137 may output the second clock signal CK_SSi of the low voltage as the second scan signal SSi, and the third output controller 139 may output the third clock signal CK_CRi of the high voltage as the carry signal CRi. The second control node QB may be set to the low voltage by the inverter (INV) 133, and the emission signal EMi of the low voltage may be output through the fourth output terminal OUT4. The second transistor T2 of each of the pixels P is turned off in response to the first scan signal SCi of the low voltage, the fourth transistor T4 in the turned-on state is turned off in response to the emission signal EMi of the low voltage, and the organic light-emitting diode OLED that is emitting light does not emit light.

Thereafter, when the first control node Q is changed to the low voltage, the first output controller 135 may output the third voltage VSS2 of the low voltage as the first scan signal SCi, the second output controller 137 may output the third voltage VSS2 of the low voltage as the second scan signal SSi, and the third output controller 139 may output the second voltage VSS1 of the low voltage as the carry signal CRi. The second control node QB may be set to the high voltage by the inverter (INV) 133, and the emission signal EMi of the high voltage may be output through the fourth output terminal OUT4. The second transistor T2 of each of the pixels P maintains or substantially maintains the turned-off state in response to the first scan signal SCi of the low voltage, the fourth transistor T4 is turned on again in response to the emission signal EMi of the high voltage, and the organic light-emitting diode OLED emits light again according to the driving current output from the first transistor T1.

In the display period DW, the on-voltage durations of the first scan signal SCi, the second scan signal SSi, and the carry signal CRi, and the off-voltage durations of the emission signal EMi, which are output from the scan driver 130, may overlap with each other. In the vertical blank period BLK, the on-voltage durations of the carry signal CRi and the off-voltage durations of the emission signal EMi, which are output from the scan driver 130, may overlap with each other.

FIG. 8A illustrates an example of the second driving mode in which the maximum driving frequency of the display apparatus is 240 Hz, and the display apparatus is driven with the changed driving frequency of 60 Hz. FIG. 8B illustrates an example in which the driving frequency of the second driving mode is lower than the driving frequency of the second driving mode according to the embodiment of FIG. 8A, and the driving of the display apparatus is the same or substantially the same as that described above with reference to FIG. 8A. For example, referring to FIG. 8B, the first clock signal CK_SCi and the second clock signal CK_SSi may be supplied to each stage of the scan driver 130 once in the display period DW according to the first driving frequency of 60 Hz, and the third clock signal CK_CRi may be supplied to each stage of the scan driver 130 once in the display period DW and three times in the vertical blank period BLK according to the maximum driving frequency of 240 Hz.

The scan driver 130 according to the present embodiment may output the emission signal EMi for turning off the fourth transistor T4 of the pixel P in the display period DW and the vertical blank period BLK according to the maximum driving frequency in the second driving mode. According to the present embodiment, the timing of the emission signal EMi output from the scan driver 130 in the vertical blank period BLK may be controlled to approximately match the optical waveforms of the first driving mode and the second driving mode, so that the display apparatus may be driven without a difference in luminance for each driving frequency.

Figure 9:
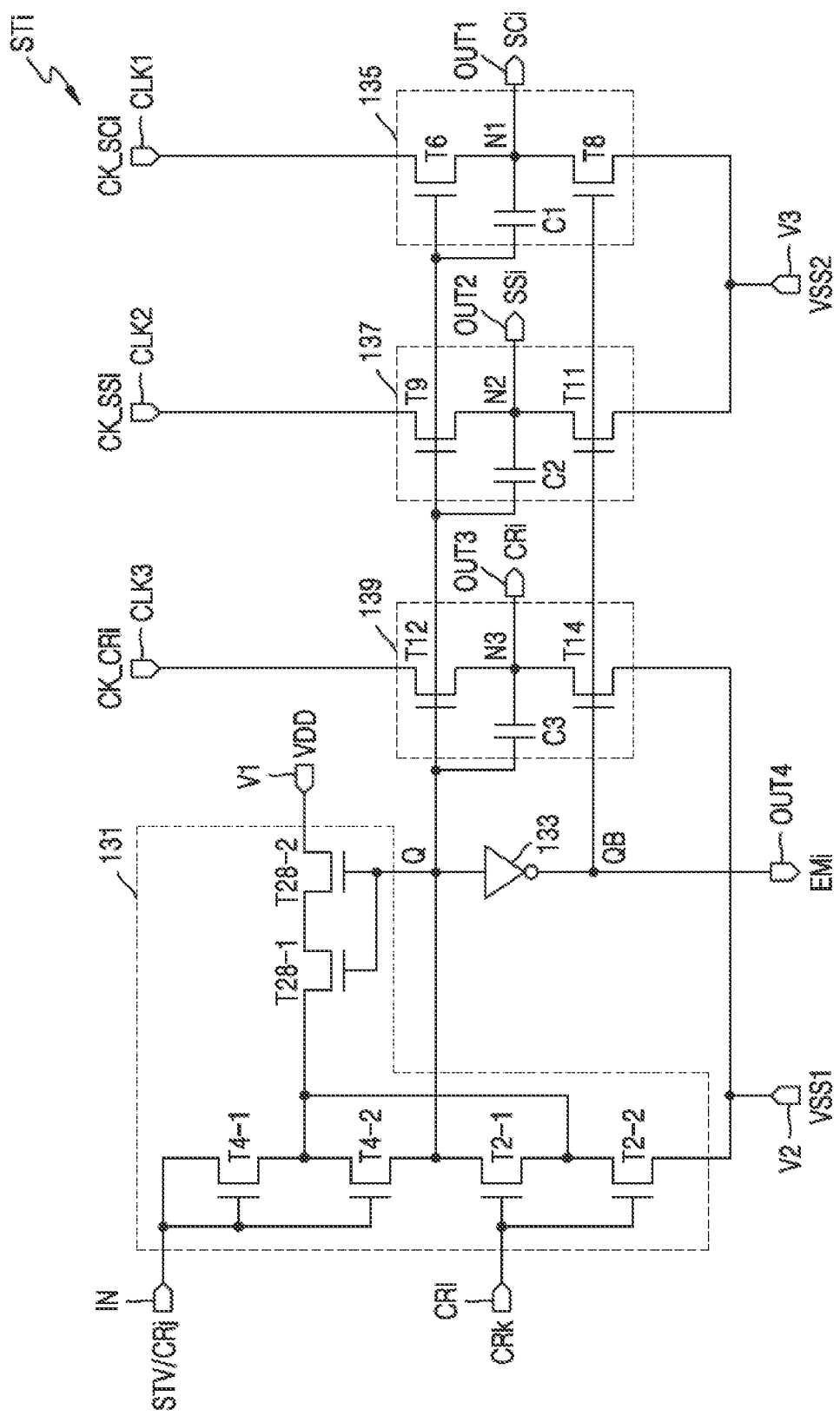
FIG. 9 is a diagram schematically illustrating a portion of a stage according to an embodiment.

FIG. 9 is a diagram schematically illustrating a portion of a stage according to an embodiment. The stage illustrated in FIG. 9 may be the same or substantially the same as (or similar to) the stage STi illustrated in FIG. 5, except a third capacitor C3 may be further included in the third output controller 139 when compared to the stage STi illustrated in FIG. 5. Hereinafter, the differences therebetween may be mainly described, and redundant description as those described above with reference to the stage STi illustrated in FIG. 5 may not be repeated.

The third capacitor C3 may be connected between the third output node N3 and the first control node Q. When the first control node Q is charged to a high voltage, the twelfth transistor T12 may be turned on so that the third clock signal CK_CRi of the high voltage is output as the high voltage of the carry signal CRi. In this case, the voltage of the first control node Q may be bootstrapped by the third capacitor C3.

In FIGS. 8A and 8B, the high voltage of the first control node Q in the vertical blank period BLK is lower than the high voltage of the first control node Q in the display period DW. This is because the first clock signal CK_SCi and the second clock signal CK_SSi are supplied as the low voltage in the vertical blank period BLK, and thus, the voltage of the first control node Q is not bootstrapped. As illustrated in FIG. 9, because the third capacitor C3 is added to the third output controller 139, the voltage of the first control node Q may be bootstrapped by the third capacitor C3 when the third clock signal CK_CRi of the high voltage is output as the carry signal CRi in the vertical blank period BLK. In this case, the voltage level of the first control node Q in the display period DW may match (e.g., may be the same or substantially the same as) the voltage level of the first control node Q in the vertical blank period BLK.

Figure 10:
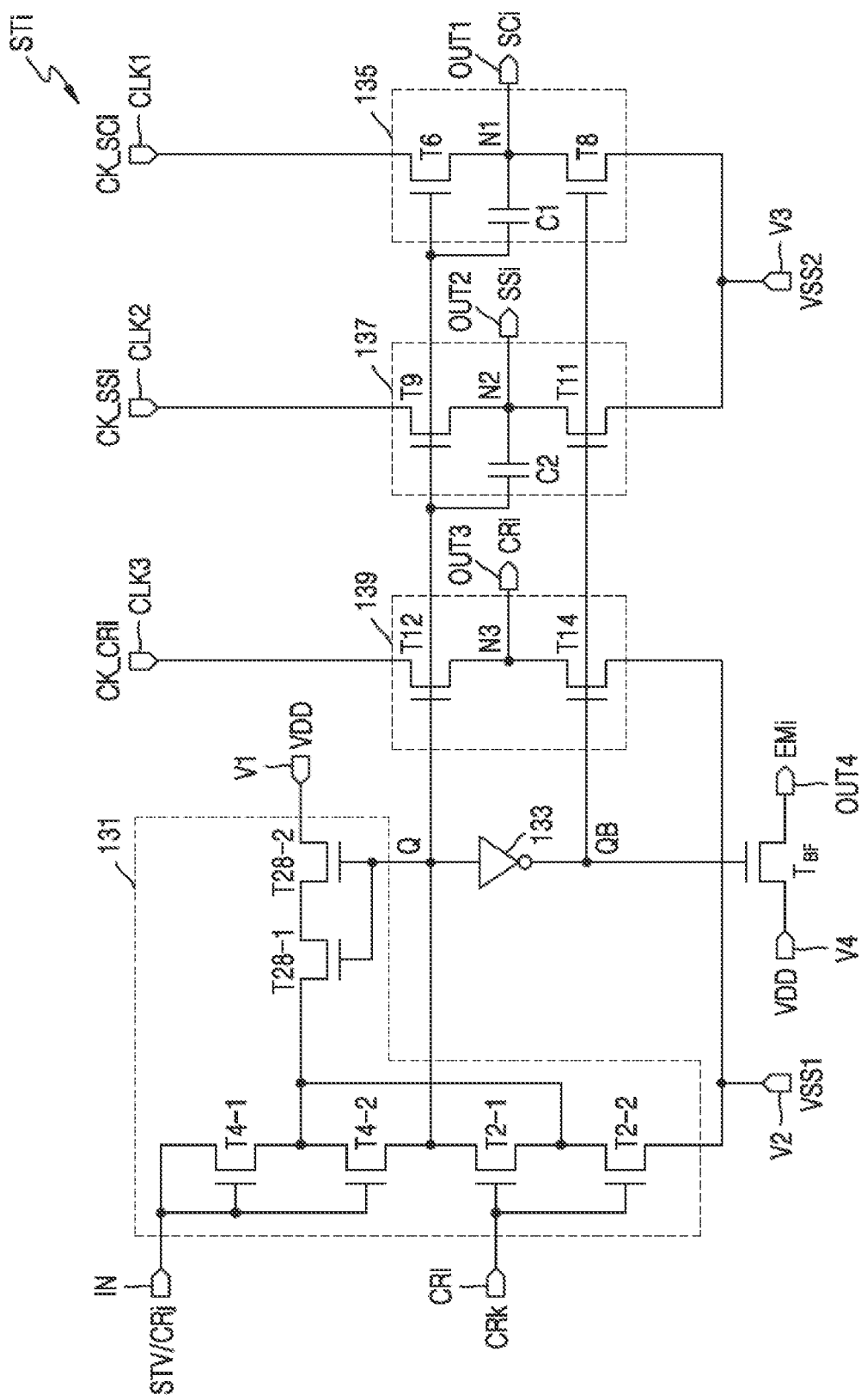
FIG. 10 is a diagram schematically illustrating a portion of a stage according to an embodiment.

FIG. 10 is a diagram schematically illustrating a portion of a stage STi according to an embodiment. The stage STi illustrated in FIG. 10 may be the same or substantially the same as (or similar to) the stage STi illustrated in FIG. 5, except that a buffer transistor TBF may be further included and connected to the inverter 133 when compared to the stage STi illustrated in FIG. 5. Hereinafter, the differences therebetween may be mainly described, and redundant description as those described above with reference to the stage STi illustrated in FIG. 5 may not be repeated.

The buffer transistor TBF may be connected between a fourth voltage input terminal V4 and the fourth output terminal OUT4. The first voltage VDD of the high voltage may be supplied to the fourth voltage input terminal V4. A gate of the buffer transistor TBF may be connected to the inverter 133. The buffer transistor TBF may be turned on or turned off in response to the voltage of the second control node QB.

When the second control node QB is set to a high voltage, the buffer transistor TBF may be turned on so that the first voltage VDD applied to the fourth voltage input terminal V4 is output through the fourth output terminal OUT4 as the emission signal EMi. Therefore, the fourth transistor T4 of the pixel circuit PC is turned on in response to the emission signal EMi of the high voltage, and the organic light-emitting diode OLED emits light according to the driving current output from the first transistor T1.

The buffer transistor TBF may be turned off when the second control node QB is set to a low voltage. Therefore, the fourth transistor T4 of the pixel circuit PC is turned off, and the organic light-emitting diode OLED does not emit light.

Because the embodiment of FIG. 10 uses a DC high voltage as the high voltage of the emission signal EMi by the buffer transistor TBF, it may be possible to minimize or reduce a phenomenon in which the emission signal EMi applied to the pixels P in the same row as each other decreases as a distance from the stage increases, when compared to the high voltage output of the inverter 133.

Also, in the stage STi illustrated in FIG. 10, the third capacitor C3 may be further included in the third output controller 139, like that illustrated in FIG. 9.

The pixel circuit PC illustrated in FIGS. 2A and 2B is only provided as an example. For example, in the above-described embodiments, the pixel P includes the third transistor T3, and the scan driver 130 supplies the second scan signal SS to the gate of the third transistor T3. However, the present disclosure is not limited thereto, and various suitable pixel circuits PC may be applicable including at least one transistor to which the scan signal is applied and a transistor to which the emission signal is applied. For example, the pixel circuit PC of the pixel P may include the first transistor T1 acting as the driving transistor, the second transistor T2 configured to transmit the data signal, and the fourth transistor T4 configured to control light emission of the organic light-emitting diode OLED, such that the third transistor T3 may be omitted, or the pixel circuit PC of the pixel P may further include at least one transistor for other suitable functions.

According to one or more embodiments of the present disclosure, a difference in luminance for each driving frequency for which the display apparatus may be driven in a variable driving frequency may be minimized or reduced. However, the aspects and features of the present disclosure are not limited to the above-described aspects and features, and may be variously expanded without departing from the spirit and scope of the present disclosure.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a pixel part comprising a plurality of pixels, each of the plurality of pixels being configured to receive a first scan signal from a first scan line from among first scan lines and an emission signal from an emission line from among emission lines; and
   a scan driver connected to the first scan lines and the emission lines, and configured to output the first scan signal to the first scan lines and the emission signal to the emission lines,
   wherein the scan driver comprises a plurality of stages, and each of the plurality of stages comprises an inverter connected between a first control node and a second control node,
   wherein the inverter is configured to invert a voltage level of a voltage of the first control node, and to supply a voltage output from the inverter to the second control node, and
   wherein the scan driver is configured to output the first scan signal according to the voltage of the first control node and to output the voltage of the second control node as the emission signal.

2. A display apparatus comprising:
   a pixel part comprising a plurality of pixels, each of the plurality of pixels being configured to receive a first scan signal and an emission signal; and
   a scan driver configured to output the first scan signal and the emission signal to each of the plurality of pixels,
   wherein, during one frame, each of the plurality of pixels is configured to be driven in a first period and a second period, the first period being a period of the one frame in which a data signal is applied in response to the first scan signal and light is emitted in response to the data signal, and the second period being a period in the one frame in which light emission is maintained, and
   wherein, the scan driver is configured to supply the first scan signal once to the plurality of pixels in the first period, and supply the emission signal once to the plurality of pixels in the first period and one or more times in the second period.

3. The display apparatus of claim 1, wherein the each of the plurality of stages further comprises:
   a first signal outputter comprising:

a first pull-up transistor comprising a gate connected to the first control node, and configured to output the first scan signal having an on voltage; and a first pull-down transistor comprising a gate connected to the second control node, and configured to output the first scan signal having an off voltage;

a second signal outputter comprising:

a second pull-up transistor comprising a gate connected to the first control node, and configured to output a carry signal having an on voltage; and a second pull-down transistor comprising a gate connected to the second control node, and configured to output the carry signal having an off voltage; and a node controller configured to control the voltage of the first control node to a first voltage for turning on the first pull-up transistor and the second pull-up transistor, or to a second voltage for turning off the first pull-up transistor and the second pull-up transistor.

4. The display apparatus of claim 3, wherein the scan driver is configured to supply the emission signal to the plurality of pixels through the emission lines according to a first frequency, and to supply the first scan signal to the plurality of pixels through the first scan lines according to a second frequency lower than the first frequency.

5. The display apparatus of claim 4, wherein:
the first pull-up transistor is connected between a first clock input terminal and a first output terminal, the first clock input terminal being configured to receive a first clock signal applied according to the second frequency; and the second pull-up transistor is connected between a second clock input terminal and a second output terminal, the second clock input terminal being configured to receive a second clock signal applied according to the first frequency.

6. The display apparatus of claim 4, wherein the node controller is configured to alternately control the voltage of the first control node to the first voltage and the second voltage according to the first frequency.

7. The display apparatus of claim 4, further comprising a buffer transistor configured to be turned on or turned off in response to an output of the inverter,
wherein when the buffer transistor is turned on, an on voltage is output as the emission signal.

8. The display apparatus of claim 5, wherein the first signal outputter further comprises a first capacitor connected between the gate of the first pull-up transistor and the first output terminal.

9. The display apparatus of claim 8, wherein the second signal outputter further comprises a second capacitor connected between the gate of the second pull-up transistor and the second output terminal.

10. The display apparatus of claim 1, wherein each of the plurality of pixels comprises:
a driving transistor;
a second transistor connected between a data line and a gate of the driving transistor, and configured to be turned on or turned off in response to the first scan signal; and
a fourth transistor connected to a driving voltage line and one end of the driving transistor, and configured to be turned on or turned off in response to the emission signal, the driving voltage line being configured to supply a first power supply voltage,
wherein the scan driver is configured to supply the emission signal to the plurality of pixels through the emission lines according to a first frequency, and to supply the first scan signal to the plurality of pixels through the first scan lines according to a second frequency lower than the first frequency.

11. The display apparatus of claim 10, wherein:
each of the plurality of pixels further comprises a third transistor connected between another end of the driving transistor and an initialization voltage line, and configured to be turned on or turned off in response to a second scan signal, the initialization voltage line being configured to supply an initialization voltage;
the scan driver is further configured to supply the second scan signal to the plurality of pixels according to the second frequency; and
an on-voltage duration of the first scan signal overlaps with an on-voltage duration of the second scan signal.

12. A display apparatus comprising a scan driver comprising a plurality of stages, each of the plurality of stages comprising:
a first signal outputter comprising:
a first pull-up transistor comprising a gate connected to a first control node, and configured to output a first scan signal having an on voltage; and
a first pull-down transistor comprising a gate connected to a second control node, and configured to output the first scan signal having an off voltage;
a second signal outputter comprising:
a second pull-up transistor comprising a gate connected to the first control node, and configured to output a carry signal having an on voltage; and
a second pull-down transistor comprising a gate connected to the second control node, and configured to output the carry signal having an off voltage;
a node controller configured to control a voltage of the first control node to a first voltage for turning on the first pull-up transistor and the second pull-up transistor, or to a second voltage for turning off the first pull-up transistor and the second pull-up transistor; and
an inverter connected between the first control node and the second control node, and configured to invert a voltage level of the voltage of the first control node, and supply a voltage output from the inverter to the second control node,
wherein, in a driving mode in which the display apparatus is driven with a first driving frequency lower than a maximum driving frequency, the scan driver is configured to output the first scan signal according to the first driving frequency, and output an output of the inverter as an emission signal according to the maximum driving frequency.

13. The display apparatus of claim 12, wherein one frame comprises a display period and a blank period, the display period being a period of the one frame in which a data signal is applied to a pixel in response to the first scan signal and the pixel emits light in response to the data signal, and the blank period being a period in the one frame in which the pixel maintains light emission.

14. The display apparatus of claim 12, wherein the first pull-up transistor is connected between a first output terminal and a first clock input terminal configured to receive a first clock signal applied according to the first driving frequency, and
wherein the second pull-up transistor is connected between a second output terminal and a second clock input terminal configured to receive a second clock signal applied according to the maximum driving frequency.

15. The display apparatus of claim 14, wherein the first signal outputter further comprises a first capacitor connected between the gate of the first pull-up transistor and the first output terminal.

16. The display apparatus of claim 15, wherein the second signal outputter further comprises a second capacitor connected between the gate of the second pull-up transistor and the second output terminal.

17. The display apparatus of claim 12, wherein the node controller is configured to alternately control the voltage of the first control node to the first voltage and the second voltage according to the maximum driving frequency.

18. The display apparatus of claim 12, wherein each of the plurality of stages further comprises a buffer transistor configured to be turned on or turned off in response to an output of the inverter,
wherein, when the buffer transistor is turned on, an on voltage is output as the emission signal.

19. The display apparatus of claim 12, further comprising a pixel part comprising a plurality of pixels configured to receive the first scan signal and the emission signal, each of the plurality of pixels comprising:
a driving transistor;
a second transistor connected between a data line and a gate of the driving transistor, and configured to be turned on or turned off in response to the first scan signal; and
a fourth transistor connected to a driving voltage line and one end of the driving transistor, and configured to be turned on or turned off in response to the emission signal, the driving voltage line being configured to supply a first power supply voltage.

20. The display apparatus of claim 19, wherein:
each of the plurality of pixels further comprises a third transistor connected between another end of the driving transistor and an initialization voltage line, and configured to be turned on or turned off in response to a second scan signal, the initialization voltage line being configured to supply an initialization voltage;
the scan driver is configured to supply the second scan signal to the plurality of pixels according to the first driving frequency in the driving mode; and
an on-voltage duration of the first scan signal overlaps with an on-voltage duration of the second scan signal.

* * * * *